(12) United States Patent  
Ahn

(10) Patent No.: US 7,535,172 B2  
(45) Date of Patent: May 19, 2009

(54) ORGANIC LIGHT EMITTING DIODE DISPLAY

(75) Inventor: Tae Joon Ahn, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 11/819,742

(22) Filed: Jun. 28, 2007

(65) Prior Publication Data

US 2008/0122354 A1     May 29, 2008

(30) Foreign Application Priority Data

Nov. 27, 2006    (KR) .................. 10-2006-0117878

(51) Int. Cl.  
    *H05B 33/00*     (2006.01)  
    *H01L 51/52*     (2006.01)

(52) U.S. Cl. .................. 313/512; 313/504; 313/553

(58) Field of Classification Search .............. 313/46, 313/33, 498–512  
See application file for complete search history.

(56) References Cited

U.S. PATENT DOCUMENTS

| | | | | |
|---|---|---|---|---|
| 6,265,820 B1* | 7/2001 | Ghosh et al. | ................ | 313/483 |
| 6,967,439 B2* | 11/2005 | Cok et al. | ................... | 313/512 |
| 7,193,364 B2* | 3/2007 | Klausmann et al. | ......... | 313/512 |
| 7,205,718 B2* | 4/2007 | Cok | ........................... | 313/512 |
| 2007/0216273 A1* | 9/2007 | Yanagawa et al. | ............. | 313/46 |

* cited by examiner

*Primary Examiner*—Ashok Patel  
(74) *Attorney, Agent, or Firm*—McKenna Long & Aldridge LLP

(57) ABSTRACT

An organic light emitting diode display for effectively emitting a heat which is generated at an organic light emitting diode device is disclosed. In the organic light emitting diode display, an organic light emitting diode device is formed at a front surface of a transparent substrate to radiate a light via the transparent substrate. And a cap is formed to enclose the organic light emitting diode device with having an internal air layer therebetween, and wherein the cap includes a glass and a metal coating layer which is coated at a bonding surface of the glass, and the bonding surface is attached to the transparent substrate.

4 Claims, 9 Drawing Sheets

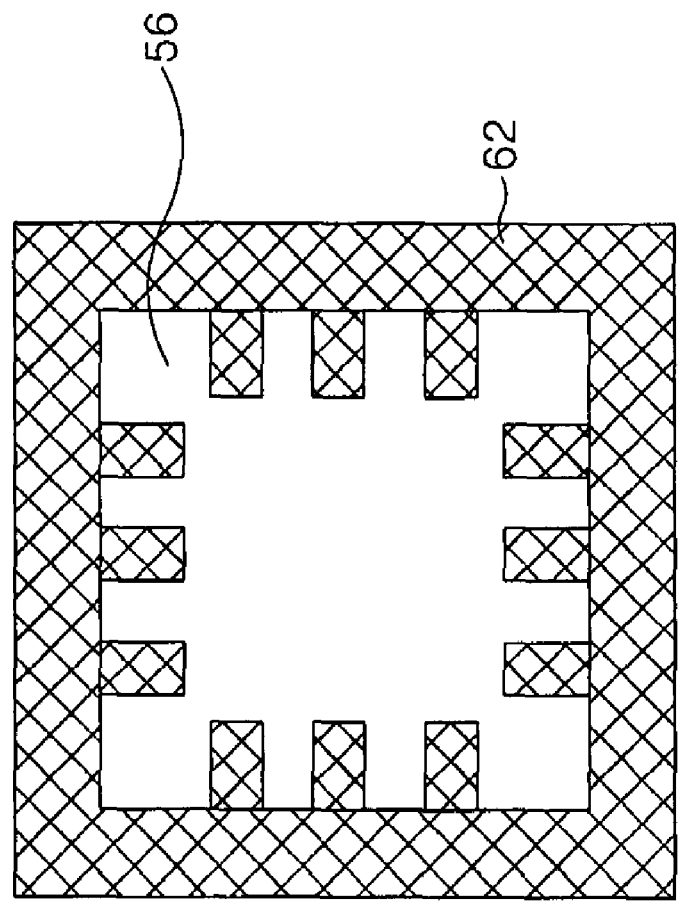

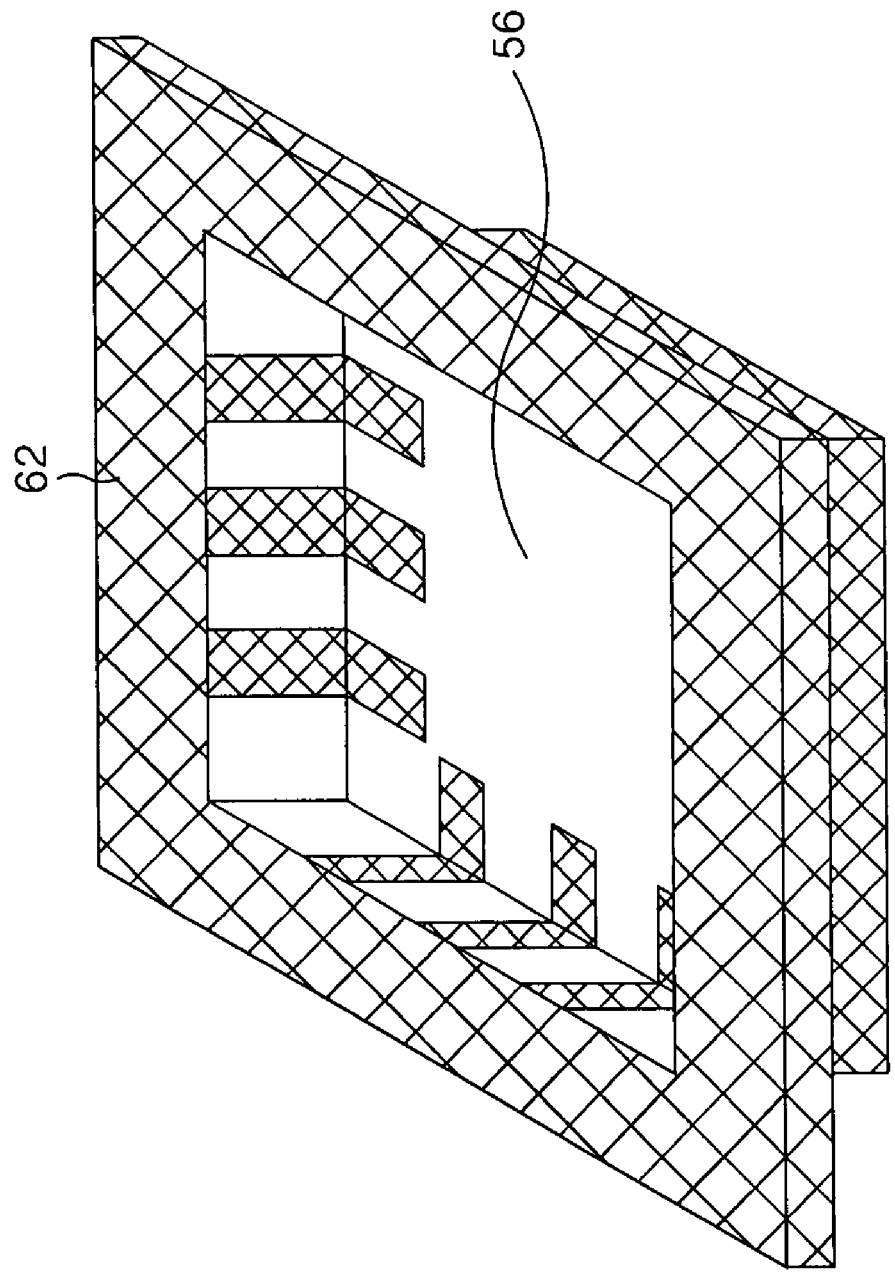

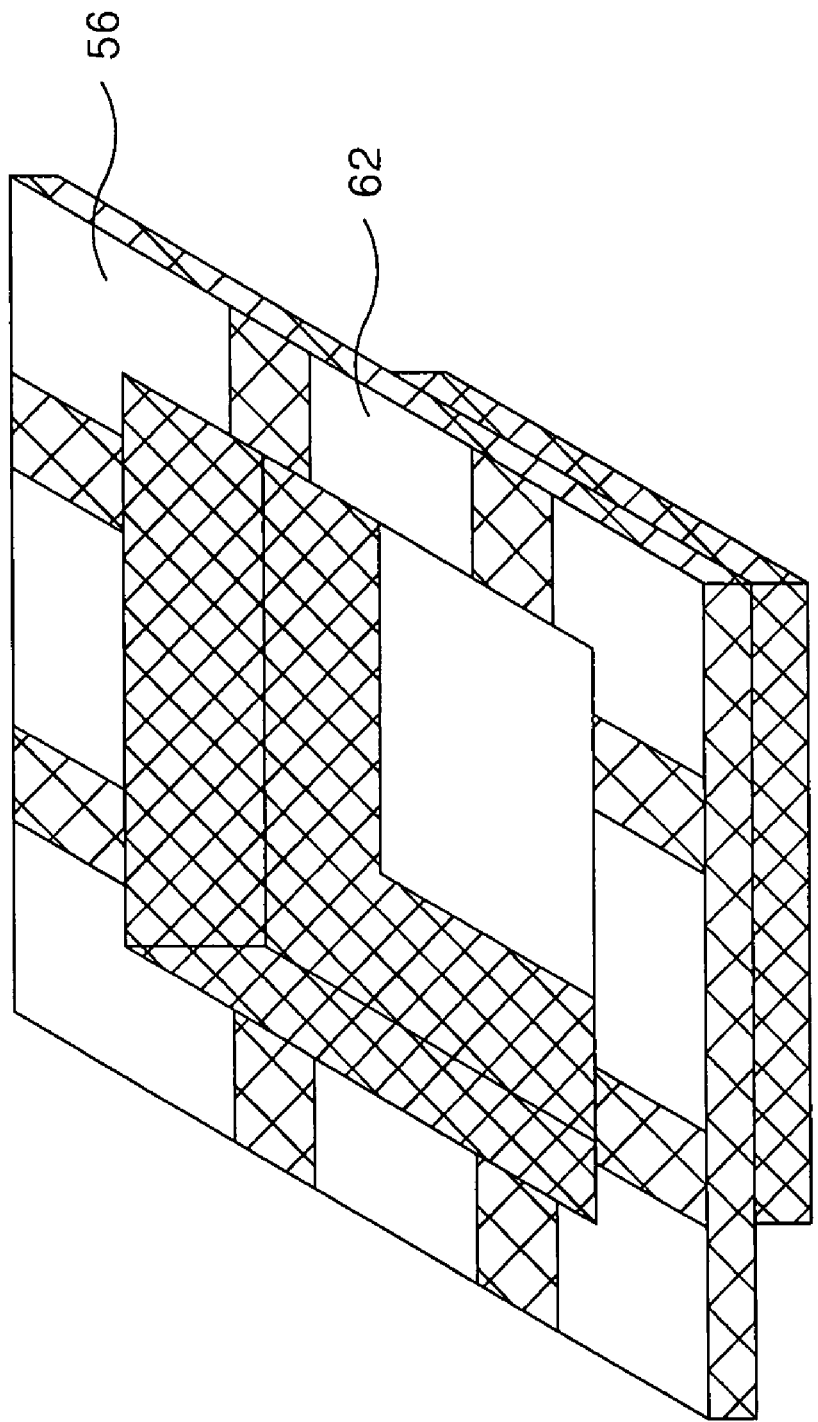

ORGANIC LIGHT EMITTING DIODE DISPLAY

This application claims the benefit of Korean Patent Application No. P2006-117878 in Korea on Nov. 27, 2006, which is hereby incorporated by reference.

BACKGROUND OF THE INVENTION

1. Field of the Invention

The present invention relates to an organic light emitting diode display, and more particularly to an organic light emitting diode display that is adaptive for effectively emitting a heat which is generated at an organic light emitting diode device.

2. Description of the Related Art

Recently, various flat panel display devices have been developed to reduce the weight and bulk so as to replace a relatively heavy and large-bulk cathode ray tube. Such flat panel display devices include a liquid crystal display (hereinafter, referred to as "LCD"), a field emission display (hereinafter, referred to as "FED"), a plasma display panel (hereinafter, referred to as "PDP"), and a light emitting diode display, etc.

The PDP has a relatively simple structure and manufacturing process. Therefore, the PDP is most advantages to be made large-sized, but it has a disadvantage of a low luminous efficiency, a low brightness, and high power consumption. Since the manufacturing process for the LCD is similar to the semiconductor process, the LCD is difficult to be made large-sized screen, and the LCD has a disadvantage in that power consumption is increased by a backlight unit. Furthermore, the LCD has a disadvantage in that its viewing angle is narrow and there is a high light loss by optical devices such as a polarizing filter, a prism sheet, and a diffusion plate, etc. On the other hand, the light emitting diode display has an advantage of a fast response speed, a high luminous efficiency, a high brightness, and a wide viewing angle.

The light emitting diode displays are largely classified into an inorganic light emitting diode display and an organic light emitting diode display depending upon the used material.

The OLED is driven with a low voltage of about 5V to 20V compared to the inorganic light emitting diode display which requires a high voltage of about 100V to 200V. Thus it possible to drive the OLED with a DC low voltage. Furthermore, since the OLED has an excellent characteristic such as a wide viewing angle, a fast response speed, and a high contrast ratio, etc., the OLED can be used as a pixel of a graphic display, a pixel of a TV picture display, or a pixel of a surface light source. Moreover, since the OLED has an advantage of thin and light weight, good color impression, it is a suitable device for the next generation flat panel display.

A method of driving the OLED is largely classified into an OLED of passive matrix type and an OLED of active matrix type.

The OLED of passive matrix type has a simple structure and a simple manufacturing process. However, the OLED of passive matrix type has a disadvantage of high power consumption. Furthermore, it is difficult to be made a large-sized. Moreover, the OLED of passive matrix type has a disadvantage in that an aperture ratio is deteriorated as the number of wire lines increases.

On the other hand, the OLED of active matrix type has an advantage of a high luminous efficiency, a high picture quality realization.

Moreover, the OLED is largely classified into a top emission type and a bottom emission type depending upon a light emitting direction thereof.

FIG. 1 is a diagram showing a bottom emission type OLED of the related art.

Referring to FIG. 1, the bottom emission type OLED of the related art includes an organic light emitting diode device 4 and a cap 6. Herein, the organic light emitting diode device 4 is formed at a front surface of a transparent substrate 2. The cap 6 packages the organic light emitting diode device 4.

The organic light emitting diode device 4 includes a first and second electrodes and an organic light emitting layer. The organic light emitting layer includes an electron injection layer, an electron transport layer, a light emitting layer, a hole injection layer, and a hole transport layer. If a voltage is applied between the first electrode and the second electrode, an electron and a hole which are generated from the first electrode and the second electrode move toward a light emitting layer via the electron injection layer, the electron transport layer, the hole injection layer, and the hole injection layer, respectively: Thus, the electron and the hole are recombined to generate a light in the organic light emitting layer. As a result, the light is emitted to the outside via the transparent substrate 2 so that a picture is displayed.

The organic light emitting diode device 4 has characteristic which is easily degraded by a gas and moisture. To solve this problem, the organic light emitting diode device 4 is protected from an external gas and moisture by an encapsulation process. Herein, the encapsulation means that the transparent substrate 2 and the cap 6 provided with the organic light emitting diode device 4 are bonded with each other by a sealant 10 such as an epoxy resin, etc. In this case, the cap 6 is mainly formed of a glass, and a getter 8 is formed at the cap 6. Herein, the getter 8 is located on a surface which opposes to the organic light emitting diode device 4 to absorb a gas and moisture.

A light and a heat are generated at the organic light emitting diode device 4 in the case where the OLED is driven. Actually, a temperature of about 50° C. is measured at the outside upon 300 nit light-emitting in the case where an OLED of 2.2 inch is driven. The generated heat degradates the organic light emitting diode device 4, thus causes a deterioration of the span of life. Since a glass which is used at the cap 6 has low heat conductivity, a heat which is generated at the organic light emitting diode device 4 within the cap 6 is not effectively emitted.

SUMMARY OF THE INVENTION

Accordingly, it is an object of the present invention to provide an organic light emitting diode display that is adaptive for effectively emitting a heat which is generated at an organic light emitting diode device.

In order to achieve these and other objects of the invention, an organic light emitting diode display according to an embodiment of the present invention comprises an organic light emitting diode device formed at a front surface of a transparent substrate to radiate a light via the transparent substrate; and a cap formed to enclose the organic light emitting diode device with having an internal air layer therebetween, and wherein the cap includes a glass and a metal coating layer which is coated at the glass, and the metal coating includes a bonding surface with the transparent substrate.

The cap includes a side wall built from the bonding surface; an upper flat surface part formed at an upper end of the side wall; and a getter formed at an inner surface of the upper flat surface part to border with the internal air layer to absorb a gas or moisture from the internal air layer.

The metal coating layer is formed at the bonding surface, at an inner surface of the side wall which borders with the internal air layer, at an outer surface of the side wall which borders with an external air layer, at an inner surface edge of the upper flat surface part, and at an outer surface edge of the upper flat surface part, respectively.

The metal coating layer which is formed at an inner surface of the side wall and an inner surface edge of the upper flat surface part has a stripe shape.

The metal coating layer which is formed at the bonding surface has a stripe shape.

BRIEF DESCRIPTION OF THE DRAWINGS

These and other objects of the invention will be apparent from the following detailed description of the embodiments of the present invention with reference to the accompanying drawings, in which:

FIG. 5A and FIG. 5B are a plan view and a perspective view showing a cap according to a second embodiment of the present invention; and FIG. 6A and FIG. 6B are a plan view and a perspective view showing a cap according to a third embodiment of the present invention.

DETAILED DESCRIPTION OF THE PREFERRED EMBODIMENT

Hereinafter, the preferred embodiments of the present invention will be described in detail with reference to FIG. 2 to FIG. 6B.

Figure 1:
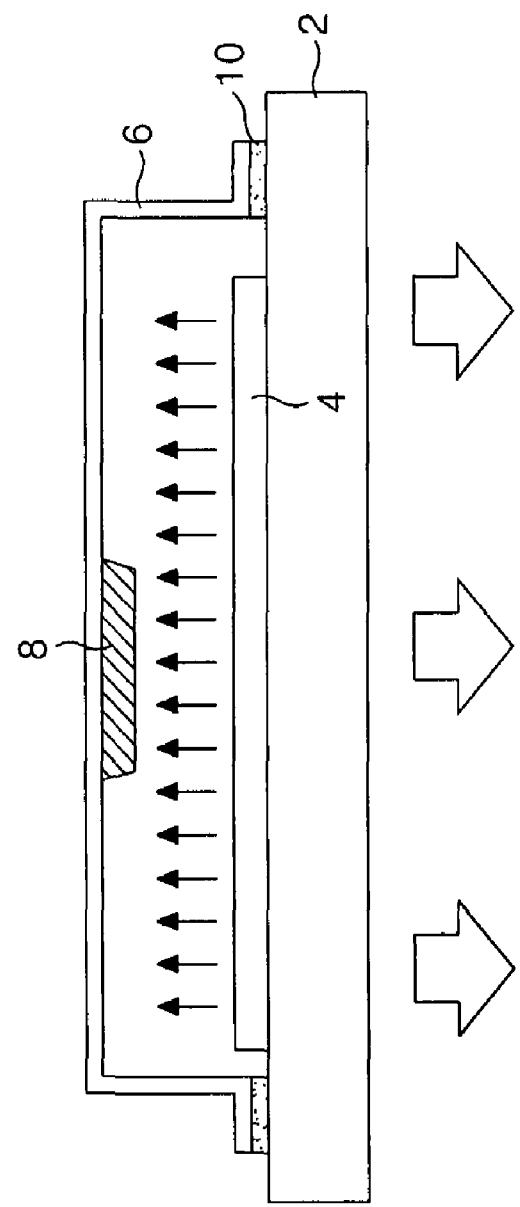
FIG. 1 is a diagram showing a bottom emission type organic light emitting diode display of the related art.
Figure 2:
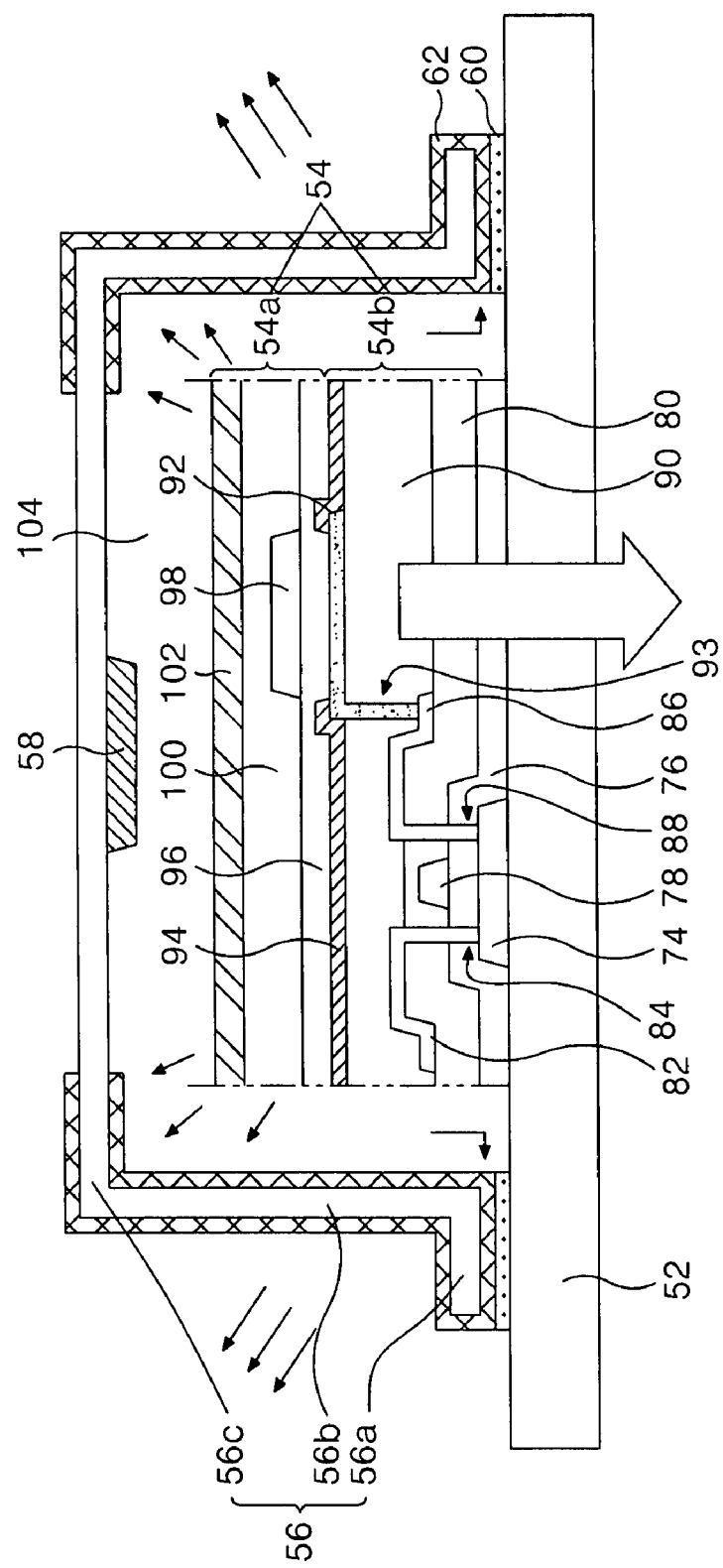
FIG. 2 is a diagram showing an organic light emitting diode display according to the present invention.

FIG. 2 is a diagram showing an organic light emitting diode display according to the present invention, and shows a bottom emission type OLED of active matrix type.

Referring to FIG. 2, the OLED according to the present invention includes a light emitting part 54 and a cap 56. Herein, the light emitting part 54 is formed at a front surface of a transparent substrate 52 to radiate a light via the transparent substrate 52. The cap 56 encloses the light emitting part 54 with having an internal air layer 104 therebetween.

The light emitting part 54 includes an organic light emitting diode device 54a and a switching device 54b that controls the organic light emitting diode device 54a.

First, the switching device 54b is a thin film transistor, and includes a semiconductor layer 74, a gate insulating film 76, a gate electrode 78, an interlayer insulating film 80, a source and a drain electrodes 82 and 86, a protective film 90, an anode electrode (or a pixel electrode) 92, and a bank 94, which are sequentially deposited on the transparent substrate 52.

The semiconductor layer 74 includes a source area where an $n^+$ impurity is injected, a drain area, and a channel area formed between the source area and the drain area. Furthermore, the semiconductor layer 74 may further include a lightly doped drain LDD area where $n^-$ impurity is injected among the channel area, the source area, and the drain area in order to reduce an off current.

The gate electrode 78 is formed to overlap a channel area of the semiconductor layer 74 with having the gate insulating film 76 therebetween. The source and drain electrodes 82 and 86 are formed to be insulated with the gate electrode 78 with having the interlayer insulating film 80 therebetween. At this moment, the source and drain electrodes 82 and 86 are connected, via a source contact hole 84 and a drain contact hole 88 which pass through the gate insulating film 76 and the interlayer insulating film 80, to a source and drain areas of the semiconductor layer 74, respectively.

The anode electrode 92 is connected, via an anode contact hole 93 which passes through the protective film 90, to the drain electrode 86 to be used as an anode electrode of the organic light emitting diode device 54a. The bank 94 defines an area of the anode electrode 92 to cause a part of the anode electrode 92 to be exposed.

The organic light emitting diode device 54a includes a hole injection/transport layers 96, a light emitting layer 98, and an electron injection/transport layers 100, and a cathode electrode 102, which are sequentially deposited on the switching device 54b.

The hole injection/transport layers 96 are entirely deposited on the anode electrode 92 and the bank 94 of the switching device 54b. The organic light emitting layer 98 is partially deposited to be overlapped with the anode electrode 92 with having the hole injection/transport layers 96 therebetween by a shadow mask. Further, the electron injection/transport layers 100 are entirely deposited on the hole injection/transport layers 96 where the organic light emitting layer 98 is partially deposited. The cathode electrode 102 is entirely deposited on the electron injection/transport layers 100.

A hole generated from the anode electrode 92 moves forward the organic light emitting layer 98 via the hole injection/transport layers 96. An electron generated from the cathode electrode 102 moves toward the organic light emitting layer 98 via the electron injection/transport layers 100. Thus, an electron and a hole collided with each other in the organic light emitting layer 98 to be re-combined, thereby emitting the light. As a result, the light is emitted to the outside through the color filter array so that a picture is displayed.

In order to prevent the light emitting part 54 from being degradated by a gas and moisture, the OLED according to the present invention further includes the cap 56. Herein, the cap 56 is formed to enclose the light emitting part 54 with having the internal air layer 104 therebetween to be bonded with the transparent substrate 52 by a sealant 60 such as an epoxy resin, etc.

The cap 56 is comprised of a bonding surface 56a, a side wall 56b, and an upper flat surface part 56c. Herein, the bonding surface 56a is stuck to the transparent substrate 52. The side wall 56b is built from the bonding surface 56a. The upper flat surface part 56c is formed at an upper end of the side wall to cover an entire upper surface of the light emitting part 54.

The cap 56 is formed of a glass, and a metal coating layer 62 is formed at the cap 56 which includes the bonding surface 56a. The metal coating layer 62 is coated on the cap 56 by a technique such as a vacuum deposition coating, etc. Herein, the vacuum deposition coating means that if a heat is applied to a metal in a high vacuum state, metal molecules are dissolved and vaporized, and then the vaporized metal corpuscle is stuck to a glass to form a crystal, thereby providing a thin film on the glass.

Such a metal coating layer 62 plays a role to radiate a heat of the internal air layer 104 which is generated at the light emitting layer 54. Heat conductivity of a glass which is used at the cap 56 is 0.7 in the case where heat conductivity of Ag is 100. On the other hand, heat conductivity of a metal, that is, heat conductivity of Cu is 92 and heat conductivity of Al is 49. In other words, the OLED according to the present invention coats a metal on the cap 56 to easily radiate a heat which is generated at the light emitting part 54. In this case, if the cap 56 is formed of a metal material in order to maximize a radiation of a light, since physical property thereof is different from the transparent substrate 52 which is formed of a glass, an adhesive strength is weakened. Furthermore, since thermal expansion coefficients of a glass and a metal are different from each other after adhering, it is difficult to maintain an adhered state of the cap 56 and the transparent substrates 52 upon driving. However, the OLED according to the present invention forms the cap 56 with a glass, and coats a metal on the cap 56 to minimize a thermal expansion coefficient difference between the cap 56 and the transparent substrate 52. As a result, the OLED according to the present invention effectively maintains an adhered state of the cap 56 and the transparent substrates 52.

Moreover, a getter 58 is formed at an inner surface of the upper flat surface part 56c of the cap 56. Herein, the cap 56 borders with the internal air layer 104, and the getter 58 absorbs a gas and moisture from the internal air layer 104.

Figure 3A:
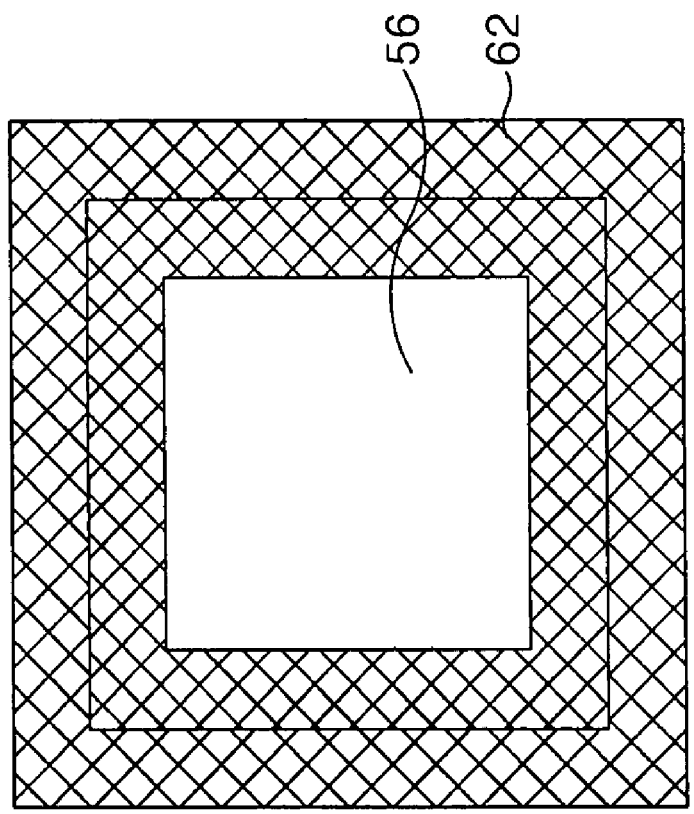
FIG. 3A and FIG. 3B are plan views showing a cap according to a first embodiment of the present invention.
Figure 3B:
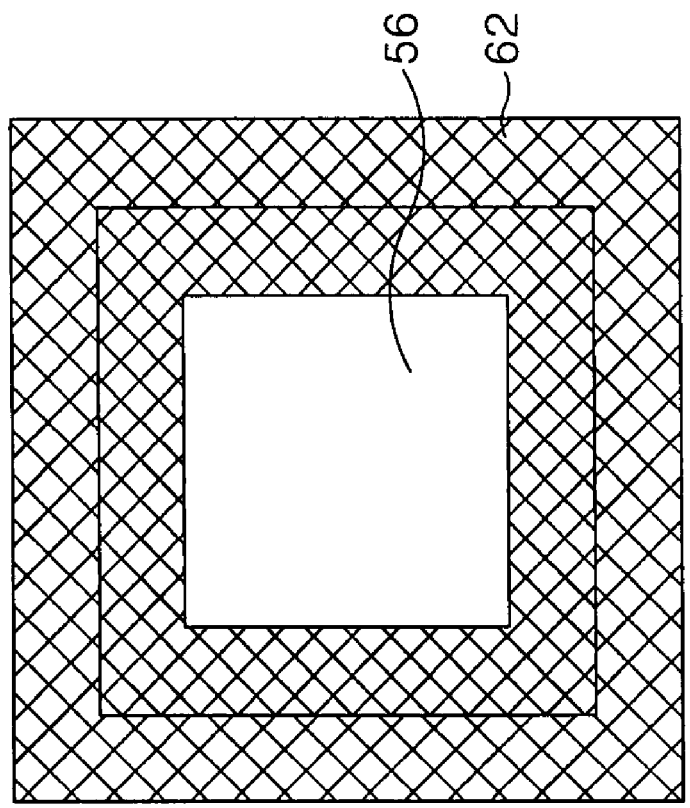
Figure 4:
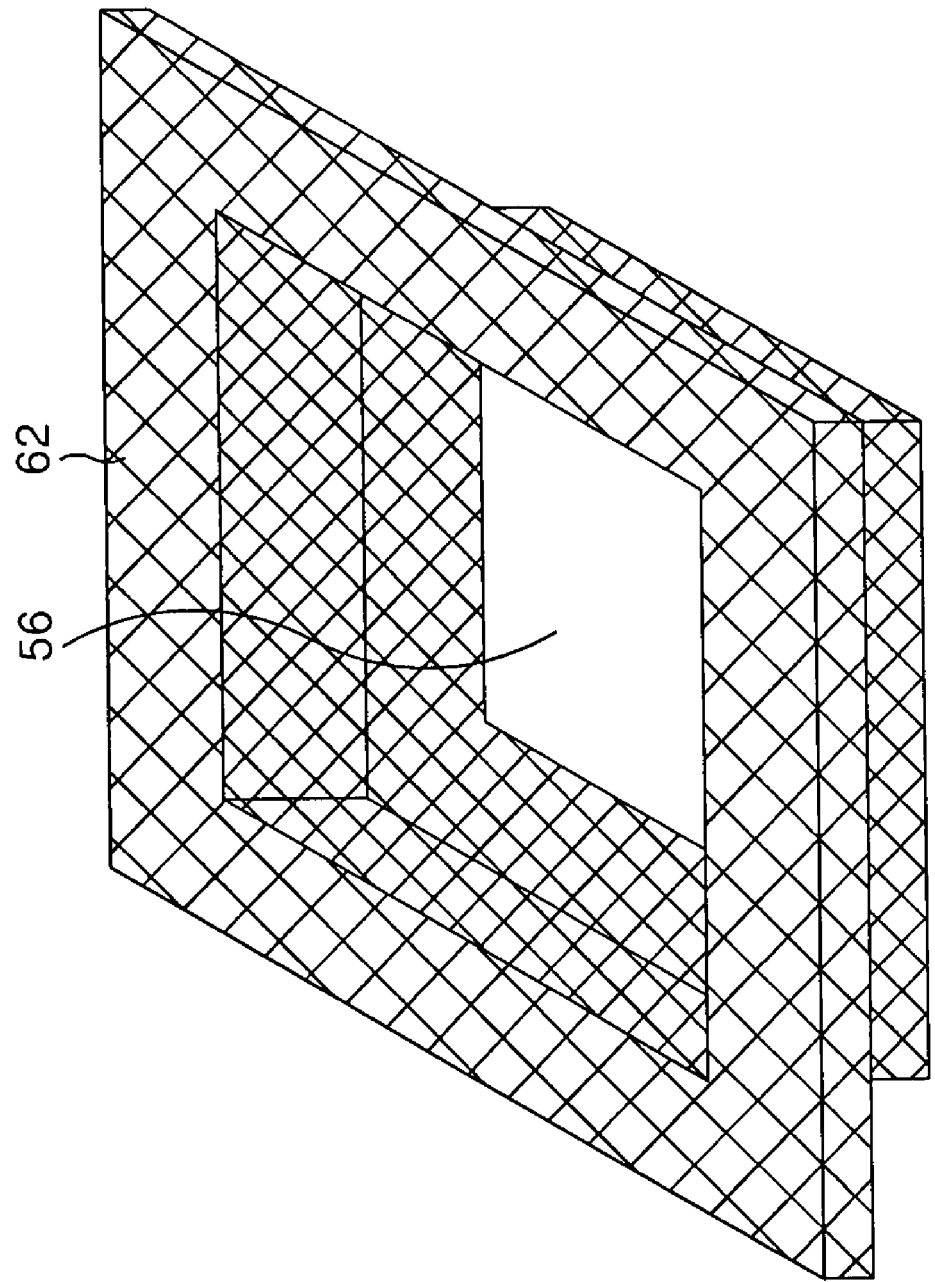
FIG. 4 is a perspective view showing a cap according to the first embodiment of the present invention.

FIG. 3A, FIG. 3B, and FIG. 4 are diagrams showing a first embodiment of the cap 56 on which the metal coating layer 62 is coated. In other words, FIG. 3A is a plan view which is shown when the observer observes the cap 56 at an outer surface of the upper flat surface part 56c which borders with an external air layer, and FIG. 3B and FIG. 4 are a plan view and a perspective view which are shown when the observer observes the cap 56 at an inner surface of the upper flat surface part 56c which borders with an internal air layer 104, respectively.

Referring to FIG. 3A, FIG. 3B, and FIG. 4, the metal coating layer 62 is formed at the bonding surface 56a of the cap 56, at an inner surface of the side wall 56b which borders with the internal air layer 104, at an outer surface of the side wall 56b which borders with an external air layer, at an inner surface edge of the upper flat surface part 56c which borders with the internal air layer 104, and at an outer surface edge of the upper flat surface part 56c which borders with the external air layer, respectively.

FIG. 5A and FIG. 5B are diagrams showing a second embodiment of the cap 56 on which the metal coating layer 62 is coated. In other words, FIG. 5A and FIG. 5B are a plan view and a perspective view which are shown when the observer observes the cap 56 at an inner surface of the upper flat surface part 56c which borders with the internal air layer 104, respectively. Herein, a plan view which is shown when the observer observes the cap 56 at an outer surface of the upper flat surface part 56c which borders with an external air layer is the same as FIG. 3A.

Referring to FIG. 3A, FIG. 5A, and FIG. 5B, the metal coating layer 62 is formed at the bonding surface 56a of the cap 56, at an inner surface of the side wall 56b which borders with the internal air layer 104, at an outer surface of the side wall 56b which borders with an external air layer, at an inner surface edge of the upper flat surface part 56c which borders with the internal air layer 104, and at an outer surface edge of the upper flat surface part 56c which borders with the external air layer, respectively. Herein, the metal coating layer 62 which is formed at an inner surface of the side wall 56b and at an inner surface edge of the upper flat surface part 56c has a stripe shape.

Figure 6A:
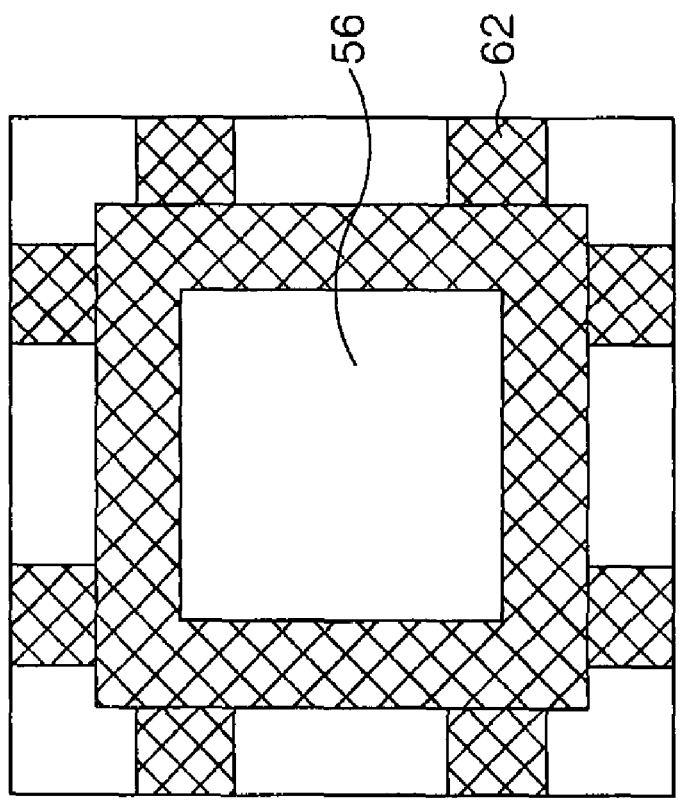

FIG. 6A and FIG. 6B are diagrams showing a third embodiment of the cap 56 on which the metal coating layer 62 is coated. In other words, FIG. 6A and FIG. 6B are a plan view and a perspective view which are shown when the observer observes the cap 56 at an inner surface of the upper flat surface part 56c which borders with the internal air layer 104, respectively. Herein, a plan view which is shown when the observer observes the cap 56 at an outer surface of the upper flat surface part 56c which borders with an external air layer is the same as FIG. 3A.

Referring to FIG. 3A, FIG. 6A, and FIG. 6B, the metal coating layer 62 is formed at the bonding surface 56a of the cap 56, at an inner surface of the side wall 56b which borders with the internal air layer 104, at an outer surface of the side wall 56b which borders with an external air layer, at an inner surface edge of the upper flat surface part 56c which borders with the internal air layer 104, and at an outer surface edge of the upper flat surface part 56c which borders with the external air layer, respectively. Herein, the metal coating layer 62 which is formed at the bonding surface 56a has a stripe shape. In this case, the metal coating layer 62 which is formed at an inner surface of the side wall 56b of the cap 56 and at an inner surface edge of the upper flat surface part 56c may be formed in a stripe shape.

As described above, the organic electric field light emitting display according to the present invention includes the cap where the metal coating layer is formed to effectively radiate a heat which is generated at the organic light emitting diode device.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic light emitting diode display, comprising:
   an organic light emitting diode device formed at a front surface of a transparent substrate to radiate a light via the transparent substrate; and
   a cap formed to enclose the organic light emitting diode device having an internal air layer therebetween,
   wherein the cap includes a glass and a metal coating layer which is coated on a bonding surface of the glass, and the bonding surface is attached to the transparent substrate,
   wherein the cap includes:
   a side wall built from the bonding surface;
   an upper flat surface part formed at an upper end of the side wall; and
   a getter formed at an inner surface of the upper flat surface part to border with the internal air layer to absorb a gas or moisture from the internal air layer,
   wherein the metal coating layer is further formed at an inner surface of the side wall which borders with the internal air layer, at an outer surface of the side wall which borders with an external air layer, at an inner surface edge of the upper flat surface part, and at an outer surface edge of the upper flat surface part, respectively.

2. The organic light emitting diode display according to claim 1, wherein the metal coating layer which is formed at an inner surface of the side wall and an inner surface edge of the upper flat surface part has a stripe shape.

3. The organic light emitting diode display according to claim 1, wherein the metal coating layer which is formed at the bonding surface has a stripe shape.

4. The organic light emitting diode display according to claim 2, wherein the metal coating layer which is formed at the bonding surface has a stripe shape.

* * * * *